United States Patent
Torimoto et al.

(10) Patent No.: US 9,028,723 B2
(45) Date of Patent: May 12, 2015

(54) SEMICONDUCTOR NANOPARTICLES AND METHOD FOR PRODUCING SAME

(75) Inventors: Tsukasa Torimoto, Nagoya (JP); Ken-ichi Okazaki, Nagoya (JP); Tatsuya Kameyama, Kitaibaraki (JP); Takaaki Osaki, Fukui (JP); Susumu Kuwabata, Ibaraki (JP); Akihiko Kudo, Kawasaki (JP)

(73) Assignees: National University Corporation Nagoya University, Nagoya (JP); Osaka University, Osaka (JP); Tokyo University of Science Educational Foundation Administrative Organization, Tokyo (JP)

( * ) Notice: Subject to any disclaimer, the term of this patent is extended or adjusted under 35 U.S.C. 154(b) by 672 days.

(21) Appl. No.: 13/203,562
(22) PCT Filed: Feb. 25, 2010
(86) PCT No.: PCT/JP2010/052917
§ 371 (c)(1), (2), (4) Date: Dec. 12, 2011
(87) PCT Pub. No.: WO2010/098369
PCT Pub. Date: Sep. 2, 2010

(65) Prior Publication Data
US 2012/0074361 A1 Mar. 29, 2012

(30) Foreign Application Priority Data
Feb. 27, 2009 (JP) .................... 2009-046785

(51) Int. Cl.
*H01B 1/02* (2006.01)
*C01B 19/00* (2006.01)
(Continued)

(52) U.S. Cl.
CPC ............... *C01B 19/002* (2013.01); *B82Y 30/00* (2013.01); *C01P 2002/72* (2013.01);
(Continued)

(58) Field of Classification Search
USPC .................. 252/519.3, 519.14; 136/263, 264; 257/76; 423/511; 977/775
See application file for complete search history.

(56) References Cited

U.S. PATENT DOCUMENTS

2002/0066401 A1    6/2002 Peng et al.
2005/0183767 A1*   8/2005 Yu et al. ........................ 136/263
(Continued)

FOREIGN PATENT DOCUMENTS

JP    A-2002-20740    1/2002
JP    A-2004-510678   4/2004
(Continued)

OTHER PUBLICATIONS

Todorov et al., "Cu2ZnSnS4 films deposited by a soft-chemistry method", available online Nov. 8, 2008, Thin Solid Film, pp. 2541-2544.*
(Continued)

*Primary Examiner* — Khanh Tuan Nguyen
(74) *Attorney, Agent, or Firm* — Oliff PLC (57) ABSTRACT

Copper(II) acetate, zinc(II) acetate, and tin(IV) acetate are weighed so that the total amount of metal ions is $2.0 \times 10^{-4}$ mol and the molar ratio of ions is Cu:Zn:Sn=2:1:1, and 2.0 cm$^3$ of oleylamine is added to prepare a mixed solution. Apart from this, 1.0 cm$^3$ of oleylamine is added to $2.0 \times 10^{-4}$ mol of sulfur powder to prepare a mixed solution. These mixed solutions are separately heated at 60° C. and mixed at room temperature. The pressure in a test tube is reduced, followed by nitrogen filling. The test tube is heated at 240° C. for 30 minutes and then allowed to stand until room temperature. The resultant product is separated into a supernatant and precipitates by centrifugal separation. The separated supernatant is filtered, methanol is added to produce precipitates. The precipitates are dissolved by adding chloroform to prepare a semiconductor nanoparticle solution.

7 Claims, 9 Drawing Sheets (51) Int. Cl.
*B82Y 30/00* (2011.01)
*C01G 19/00* (2006.01)
*C01G 3/12* (2006.01)
*H01L 21/02* (2006.01)

(52) U.S. Cl.
CPC ........ *C01P 2002/77* (2013.01); *C01P 2002/82* (2013.01); *C01P 2002/85* (2013.01); *C01P 2004/04* (2013.01); *C01P 2004/64* (2013.01); *H01L 21/02557* (2013.01); *H01L 21/0256* (2013.01); *H01L 21/02568* (2013.01); *H01L 21/02628* (2013.01); *C01G 19/006* (2013.01); *C01G 3/12* (2013.01); *Y10S 977/775* (2013.01)

(56) References Cited

U.S. PATENT DOCUMENTS

| | | | |
|---|---|---|---|
| 2006/0039850 | A1 | 2/2006 | Jun et al. |
| 2008/0159902 | A1 | 7/2008 | Shim et al. |
| 2008/0303035 | A1* | 12/2008 | Oike et al. ................ 257/76 |
| 2009/0278094 | A1 | 11/2009 | Torimoto et al. |
| 2011/0056564 | A1* | 3/2011 | Korgel et al. ................ 136/265 |

FOREIGN PATENT DOCUMENTS

| | | |
|---|---|---|
| JP | A-2005-325016 | 11/2005 |
| JP | A-2008-57041 | 3/2008 |
| JP | A-2008-192542 | 8/2008 |
| WO | WO 2007/026746 A1 | 3/2007 |
| WO | WO 2007-026746 A1 * | 3/2007 ............... B82B 1/00 |
| WO | WO 2007/075886 A2 | 7/2007 |
| WO | WO 2009/006910 A2 | 1/2009 |
| WO | WO 2009-137637 A2 * | 11/2009 ............... B22F 1/00 |

OTHER PUBLICATIONS

Guen, "Electrical, Magnetic, and EPR Studies of the Quaternary Chalcogenides $Cu_2A^{II}B^{IV}X_4$ Prepared by Iodine Transport," *Journal of Solid State Chemistry,* 1980, vol. 35, pp. 10-21.

Olekseyuk et al., "Single crystal preparation and crystal structure of the $Cu_2Zn/Cd,Hg/SnSe_4$ compounds," *Journal of Alloys and Compounds,* 2002, vol. 340, pp. 141-145.

Mellikov et al., "Monograin materials for solar cells," *Solar Energy Materials & Solar Cells,* 2009, vol. 93, pp. 65-68.

"Latest Technology of Compound Thin Film Solar Cells," Edited by Takahiro Wada, 2007, pp. 192-197 (with partial English-language translation).

International Search Report in International Application No. PCT/JP2010/052917; dated May 25, 2010 (with English-language translation).

International Preliminary Report on Patentability in International Application No. PCT/JP2010/052917; dated Sep. 13, 2011 (with English-language translation).

Jul. 8, 2014 Office Action issued in Japanese Application No. 2011-501629 (with English Translation).

* cited by examiner

EXAMPLE 3 (30 min)    EXAMPLE 5 (60 min)    EXAMPLE 6 (120 min)

$D_{av}$=5.4 nm  $\sigma$ =1.2 nm    $D_{av}$=6.7 nm  $\sigma$ =1.4 nm    $D_{av}$=6.4 nm  $\sigma$ =1.1 nm

SEMICONDUCTOR NANOPARTICLES AND METHOD FOR PRODUCING SAME

TECHNICAL FIELD

The present invention relates to semiconductor nanoparticles and a method of producing the same.

BACKGROUND ART

Various material searches have been conducted with the aim at forming high-efficiency solar cells. It has been recently reported that high-efficiency solar cells can be formed using chalcopyrite semiconductors, such as $CuInSe_2$ (CIS), which are compound semiconductors, and such cells attract attention as next-generation solar cells alternative to silicon solar cells. For example, Patent Literature 1 proposes a method for producing high-quality chalcopyrite nanoparticles. Although it is considered that devices for light-electricity conversion are easily produced by using chalcopyrite nanoparticles, there is the worry about future stable supply of In because rare element In is contained, and search for alternative materials is continued.

Materials having received attention quite recently include $Cu_2ZnSnS_4$ (CZTS) semiconductor. The CZTS semiconductor has a structure in which In in a CIS semiconductor is substituted by Zn and Sn and attracts attention as a material for high-efficiency solar cells. For example, in Non-Patent Literature 1, a solar cell using a CZTS semiconductor is formed as follows. First, a soda lime glass substrate is sputter-coated with molybdenum, and a CZTS thin film is formed thereon by a sulfurization method. Then, a buffer layer composed of CdS is deposited by a solution growth method, a window layer composed of ZnO:Al is deposited by a rf sputtering method, and a comb-shaped collector electrode composed of Al is deposited by a vacuum deposition method. The sulfurization method for forming the CZTS thin film is a two-stage forming method including forming a Cu—Zn—Sn—S precursor using a ternary simultaneous sputtering apparatus and then heat-treating the precursor in a hydrogen sulfide atmosphere after transferring it into an annealing chamber.

CITATION LIST

PTL 1: JP 2008-192542 A
NPL 1: "Latest Technology of Compound Thin Film Solar Cells" p. 192-197, edited by Takahiro Wada, first issued on Jun. 30, 2007, CMC Publishing Inc.

DISCLOSURE OF INVENTION

As described above, only limited physical methods such as a sputtering method have so far been known as methods for forming CZTS thin films. Therefore, there has been demand for forming CZTS thin films by a more convenient method. Also, there has been demand for forming thin films of materials having crystal structures similar to the tetragonal system stannite crystal structure of CZTS by a simple method. Thus, a conceivable method for forming thin films of CZTS and materials having crystal structures similar to that of CZTS includes dropping a solution of nanoparticles of these materials on a substrate and then drying the solution. In this method, the nanoparticles of the materials are required. However, there has so far been no example of report on such nanoparticles as far as the inventors know.

The present invention has been achieved for resolving the above-mentioned problem and a main object of the invention is to provide nanoparticles of CZTS and materials having crystal structures similar to that of CZTS.

As a result of intensive research for achieving the main object, the inventors have found that CZTS nanoparticles having a nanometer-scale particle diameter are produced by adding salts containing, respectively, $Cu^{2+}$, $Zn^{2+}$, and $Sn^{4+}$, and sulfur to oleylamine and then heating the resultant mixture at 200° C. to 300° C., and that a CZTS thin film electrode formed by applying a solution of the nanoparticles to an electrode and then drying the solution exhibits characteristics as p-type semiconductors when irradiated with light, leading to the completion of the present invention.

That is, a method for producing semiconductor nanoparticles according to the present invention includes preparing a mixed solution by adding, to a lipid-soluble solvent, a simple substance or compound of a Group 11 element in the periodic table, a simple substance or compound of a Group 12 element in the periodic table, a simple substance or compound of a Group 14 element in the periodic table, and a simple substance or compound of a Group 16 element in the periodic table, and then heating the mixed solution to produce semiconductor nanoparticles.

The semiconductor nanoparticles of the present invention have a crystal structure composed of a Group 11 element in the periodic table, a Group 12 element in the periodic table, a Group 14 element in the periodic table, and a Group 16 element in the periodic table.

According to the method for producing semiconductor nanoparticles of the present invention, semiconductor nanoparticles such as CZTS can be simply produced. A semiconductor thin film can be simply produced by adding the semiconductor nanoparticles to a proper solvent to prepare a semiconductor nanoparticle solution, applying the solution on an electrode substrate, and then drying the solution.

BEST MODE FOR CARRYING OUT THE INVENTION

A method for producing semiconductor nanoparticles according to the present invention includes preparing a mixed solution by adding, to a lipid-soluble solvent, a simple substance or compound of a Group 11 element in the periodic table, a simple substance or compound of a Group 12 element in the periodic table, a simple substance or compound of a Group 14 element in the periodic table, and a simple substance or compound of a Group 16 element in the periodic table, and then heating the mixed solution.

Examples of the Group 11 element in the periodic table include Cu, Ag, and Au, and among these elements, Cu and Ag are preferred, and Cu is particularly preferred. Examples of the Group 12 element in the periodic table include Zn and Cd, and Zn among these elements is preferred. Examples of the Group 14 element in the periodic table include Si, Ge, Sn, and Pb, and Sn among these elements is preferred. Examples of the Group 16 element in the periodic table include O, S, Se, and Te, and these elements may be mixed. As the Group 16 element in the periodic table, S or Se is preferred, and a mixture of S and Se is also preferred. When at least one of a compound of the Group 11 element in the periodic table, a compound of the Group 12 element in the periodic table, and a compound of the Group 14 element in the periodic table contains the Group 16 element in the periodic table, the simple substance or compound of the Group 16 element in the periodic table need not be added to the mixed solution. For example, when the compound of the Group 11 element in the periodic table contains the Group 16 element in the periodic table, the compound is a compound of the Group 11 element as well as being a compound of the Group 16 element. As a specific example, zinc diethyldithiocarbamate $Zn(S_2CN(C_2H_5)_2)_2$ is a Zn compound as well as being a S compound.

Examples of the lipid-soluble solvent include nitrogen-containing compounds each containing a hydrocarbon group having 4 to 20 carbon atoms, sulfur-containing compounds each containing a hydrocarbon group having 4 to 20 carbon atoms, and oxygen-containing compounds each containing a hydrocarbon group having 4 to 20 carbon atoms. Examples of the hydrocarbon group having 4 to 20 carbon atoms include saturated aliphatic hydrocarbon groups, such as a n-butyl group, an isobutyl group, a n-pentyl group, an octyl group, a decyl group, a dodecyl group, a hexadecyl group, and an octadecyl group; unsaturated aliphatic hydrocarbon groups, such as an oleyl group; alicyclic hydrocarbon groups, such as a cyclopentyl group and a cyclohexyl group; and aromatic hydrocarbon groups, such as a phenyl group, a benzyl group, a naphthyl group, and a naphthylmethyl group. Among these groups, the saturated aliphatic hydrocarbon groups and the unsaturated aliphatic hydrocarbon groups are preferred. Examples of the nitrogen-containing compounds include amines and amides, examples of the sulfur-containing compounds include thiols, and examples of the oxygen-containing compounds include fatty acids. Among these lipid-soluble compounds, the nitrogen-containing compounds each containing a hydrocarbon group having 4 to 20 carbon atoms are preferred. Preferred examples of such compounds include alkylamines such as n-butylamine, isobutylamine, n-pentylamine, n-hexylamine, octylamine, decylamine, dodecylamine, hexadecylamine, and octadecylamine; and alkenylamines such as oleylamine. The lipid-soluble compound can be bonded to the surfaces of the particles. Examples of the bond type include chemical bonds such as a covalent bond, an ionic bond, a coordination bond, a hydrogen bond, and a Van der Waals bond.

The heating temperature of the mixed solution may be appropriately determined according to the type of the simple substance or compound used, and, for example, is preferably determined in the range of 130° C. to 300° C. and more preferably in the range of 240° C. to 300° C. An excessively low heating temperature is undesired because of difficulty in unifying a crystal structure. In addition, the heating time may be appropriately determined according to the type of the simple substance or compound used and the heating temperature, and, in general, is preferably set in the range of several seconds to several hours and more preferably in the range of 1 to 60 minutes.

In the method for producing semiconductor nanoparticles of the present invention, the mixed solution after heating may be cooled and then separated into a supernatant and precipitates, and the separated precipitates may be placed in an organic solvent (for example, chloroform, toluene, hexane, n-butanol, or the like) to prepare a semiconductor nanoparticle solution. Alternatively, the mixed solution after heating may be cooled and then separated into a supernatant and precipitates, a solvent (for example, methanol, ethanol, acetone, acetonitrile, or the like) in which the nanoparticles are insoluble or slightly soluble may be added to the separated supernatant to produce precipitates, and the precipitates are collected and placed in the organic solvent to prepare a semiconductor nanoparticle solution.

The semiconductor nanoparticles of the present invention have a crystal structure composed of the Group 11 element in the periodic table, the Group 12 element in the periodic table, the Group 14 element in the periodic table, and the Group 16 element in the periodic table. Such semiconductor nanoparticles can be produced by, for example, the above-described method for producing semiconductor nanoparticles. In addition, the particle size of the semiconductor nanoparticles is preferably 100 nm or less, more preferably 50 nm or less, and most preferably 20 nm or less. In this case, the Group 11 element in the periodic table, the Group 12 element in the periodic table, the Group 14 element in the periodic table, and the Group 16 element in the periodic table are the same as described above for the method for producing semiconductor nanoparticles, and thus a description thereof is omitted.

The semiconductor nanoparticles of the present invention preferably have a stannite-type or similar crystal structure or a stannite-type or similar crystal structure in which the Group 11 element in the periodic table and the Group 14 element in the periodic table are partially substituted by the Group 12 element in the periodic table. Examples of substances having the stannite-type crystal structure include $Cu_2ZnSnS_4$, $Cu_2ZnSnSe_4$, $Cu_2ZnGeSe_4$, $Cu_2CdSnS_4$, $Cu_2CdSnSe_4$, $Cu_2CdGeSe_4$, and the like. Examples of the crystal structure similar to the stannite-type crystal structure include a kesterite type, a wurtz-stannite type, a zincblende type, a wurtz type, and the like. Examples of substances having the wurtz-stannite-type structure include $Cu_2ZnGeS_4$, $Cu_2CdGeS_4$, $Ag_2CdGeSe_4$, and the like. Examples of substances having the zincblende-type structure include $Ag_2ZnGeSe_4$ and the like. Examples of substances having the wurtz-type structure include $Ag_2CdSnS_4$, $Ag_2CdSnSe_4$, and the like. An example of the stannite-type crystal structure in which the Group 11 element in the periodic table and the Group 14 element in the periodic table are partially substituted by the Group 12 element in the periodic table is a structure in which Cu and Sn of $Cu_2ZnSnS_4$ are partially (part of Cu, part of Sn, or part of Cu and part of Sn) substituted by Zn.

EXAMPLES

Examples 1 to 6

1. Preparation of Semiconductor Nanoparticles

Figure 1:
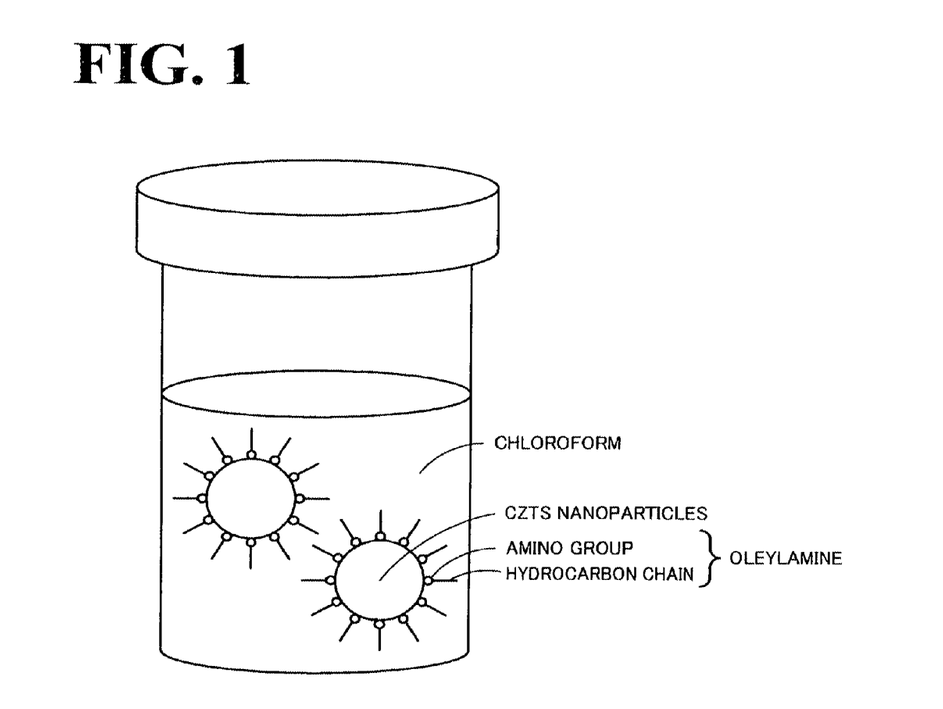
FIG. 1 is a schematic drawing of a semiconductor nanoparticle solution.
Figure 2:
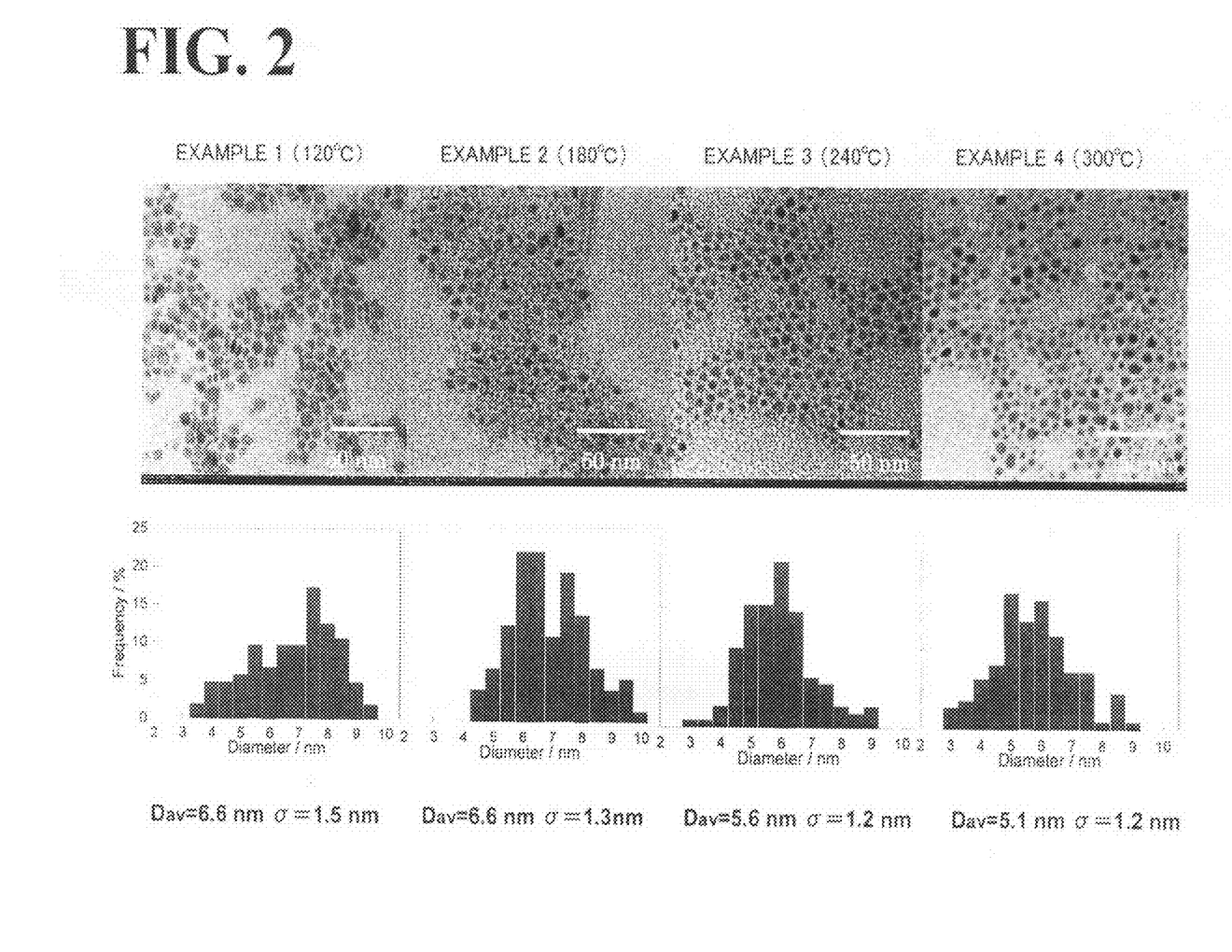
FIG. 2 is an explanatory diagram illustrating TEM images of Examples 1 to 4 and average particle diameters Dav and standard deviations σ calculated based on the TEM images.

Copper (II) acetate, zinc (II) acetate, and tin (IV) acetate were weighed so that the total amount of metal ions was $2.0 \times 10^{-4}$ mol and the molar ratio of ions was Cu:Zn:Sn=2:1:1, and 2.0 cm³ of oleylamine was added to prepare a mixed solution. Apart from this, 1.0 cm³ of oleylamine was added to $2.0 \times 10^{-4}$ mol of sulfur powder to prepare a mixed solution. These mixed solutions were separately heated at 60° C. to prepare uniform solutions. The two solutions were mixed at room temperature, and the pressure in a test tube was reduced, followed by nitrogen filling. The reaction temperature was 120° C., 180° C., 240° C., and 300° C. in Examples 1, 2, 3, and 4, respectively. In each of the Examples, the test tube was heated for 30 minutes and then allowed to stand until room temperature. On the other hand, in Examples 5 and 6, the test tube was heated at 240° C. for 60 minutes and 120 minutes, respectively, and then allowed to stand until room temperature. The product obtained in each of the Examples was separated into a supernatant and precipitates by centrifugal separation. The separated supernatant was filtered, methanol was added to the filtrate to produce precipitates, and the resultant precipitates were recovered by centrifugal separation. Then, the precipitates were dissolved by adding chloroform to prepare a semiconductor nanoparticle solution. FIG. 1 is a schematic drawing showing the semiconductor nanoparticle solution. In addition, the production conditions of Examples 1 to 6 are summarized in Table 1.

that at 240° C. and 300° C. This is possibly due to the fact that crystal growth proceeds at a lower reaction temperature, while nucleation is prior to crystal growth at a higher temperature.

Figure 3:
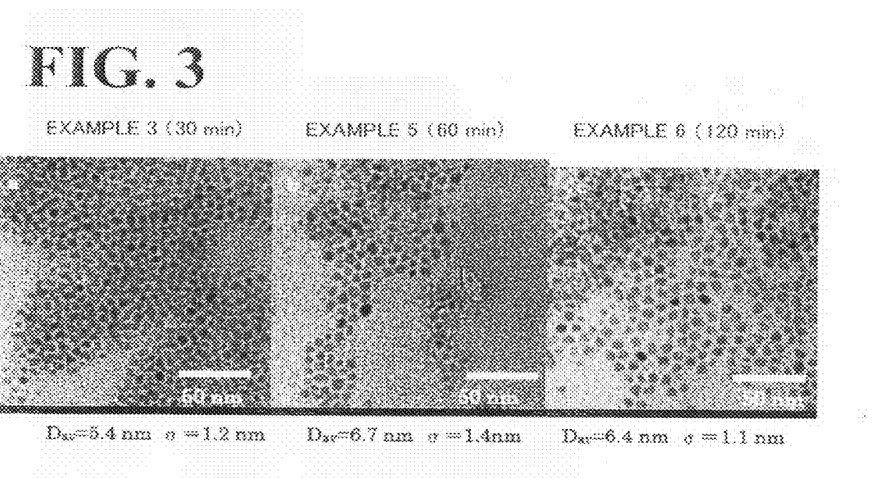
FIG. 3 is an explanatory diagram illustrating TEM images of Examples 3, 5, and 6 and average particle diameters Dav and standard deviations σ calculated based on the TEM images.

FIG. 3 shows the TEM images of CZTS nanoparticles and the average particle diameters Dav and standard deviations σ calculated based on the TEM images, the nanoparticles being produced at a reaction temperature of 240° C. with a reaction time increased from 30 minutes (Example 3) to 60 minutes (Example 5) and 120 minutes (Example 6). The TEM images shown in FIG. 3 show an increase of 1 nm or more in particle diameter by increasing the reaction time from 30 minutes to 60 minutes, but show not so large difference in particle diameter even by increasing the reaction time from 60 minutes to 120 minutes. Therefore, particle growth is considered not to proceed even by increasing the reaction time to 60 minutes or more at the reaction temperature of 240° C.

(2) XRD Pattern

Figure 4:
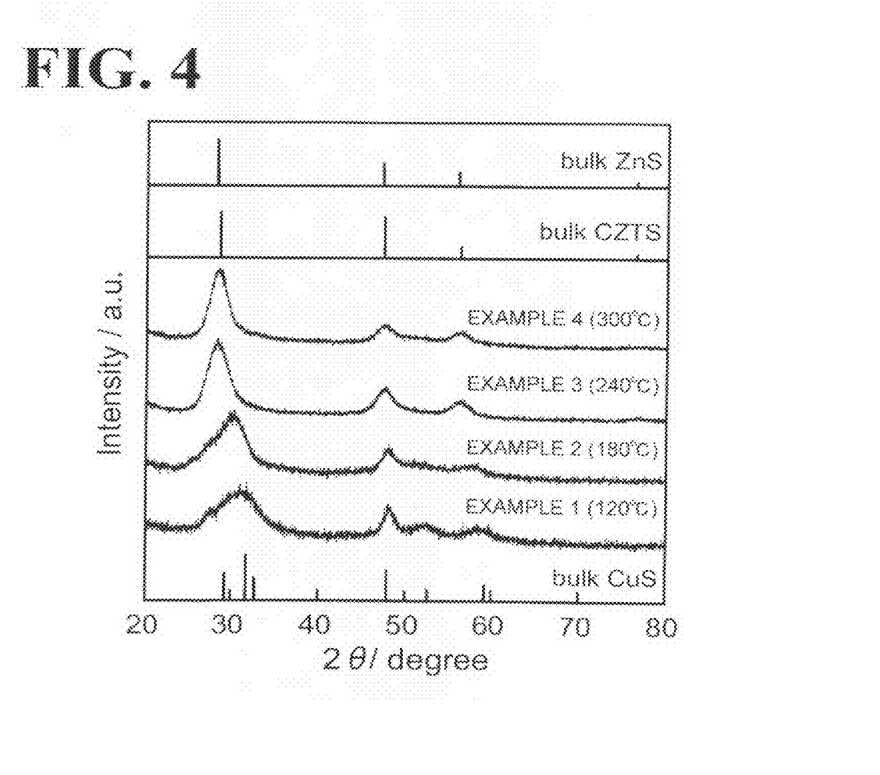
FIG. 4 is an explanatory diagram illustrating XRD patterns of Examples 1 to 4, ZnS, CZTS, and CuS.
Figure 5:
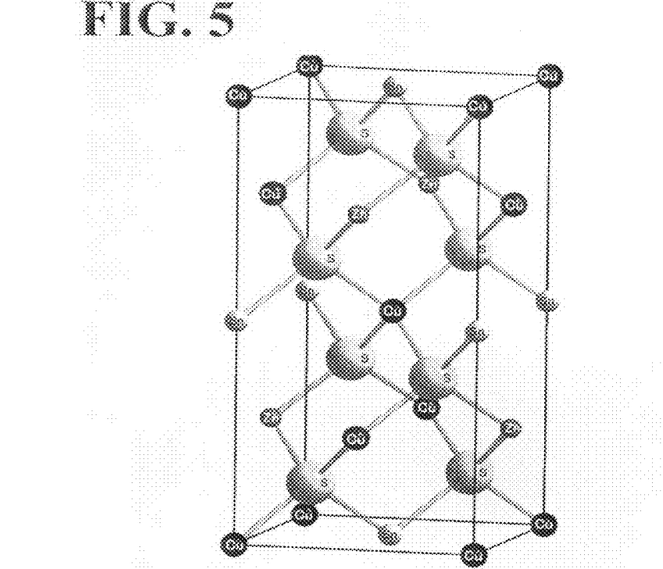
FIG. 5 is an explanatory diagram illustrating a stannite-type crystal structure.
Figure 6:
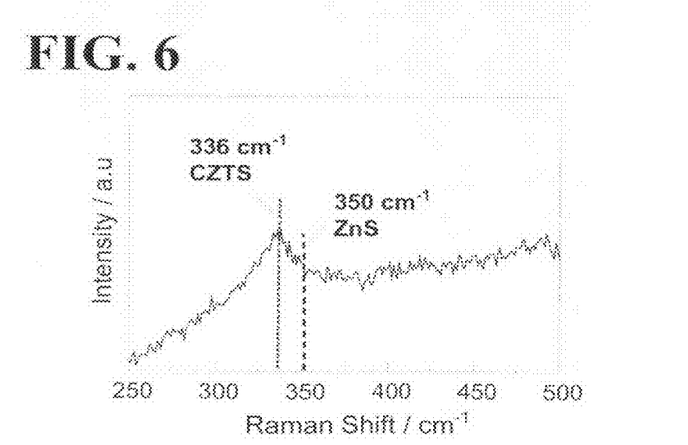
FIG. 6 is an explanatory diagram of a Raman spectrum of nanoparticles of Example 3.

XRD patterns of the semiconductor nanoparticles produced in Examples 1 to 4 were measured and compared with XRD patterns of ZnS, $Cu_2ZnSnS_4$ (CZTS), and CuS. The comparison of the XRD patterns is shown in FIG. 4. The XRD patterns shown in FIG. 4 indicate that the main product at the reaction temperature of 120° C. is CuS, a mixture of CuS and CZTS is produced by increasing the reaction temperature to 180° C., and the XRD pattern at 240° C. or more agrees with the profile of CZTS. These results reveal that in order to produce CZTS nanoparticles with a high efficiency, the reaction temperature is preferably determined in the range of 240° C. to 300° C. CZTS has a stannite-type crystal structure shown in FIG. 5. In addition, the XRD patterns of CZTS and ZnS are substantially the same, but in a measured Raman spectrum of the nanoparticles of Example 3, a signal attributed to CZTS appears, while no signal attributed to ZnS appears as shown in FIG. 6. Thus, it was confirmed that the XRD pattern of the nanoparticles is attributed to CZTS. In addition, as a result of composition analysis of the CZTS nanoparticles produced in Example 3 by fluorescent X-ray

TABLE 1

| | PRODUCTION CONDITIONS | | | PARTICLE DIAMETER OF | CRYSTAL |
|---|---|---|---|---|---|
| | REACTION PRECURSOR | TEMPERATURE | TIME | NANOPARTICLES | STRUCTURE |
| EXAMPLE 1 | Cu: COPPER (II) ACETATE | 120° C. | 30 min | 6.6 ± 1.2 nm | CuS |
| EXAMPLE 2 | Zn: ZINC (II) ACETATE DIHYDRATE | 180° C. | 30 min | 6.6 ± 1.3 nm | CuS, CZTS |
| EXAMPLE 3 | Sn: TIN (IV) ACETATE | 240° C. | 30 min | 5.6 ± 1.2 nm | CZTS |
| EXAMPLE 4 | S: SULFUR POWDER | 300° C. | 30 min | 5.6 ± 1.3 nm | CZTS |
| EXAMPLE 5 | (MOLAR RATIO OF 2:1:1:4) | 240° C. | 60 min | 6.7 ± 1.4 nm | CZTS |
| EXAMPLE 6 | SOLVENT: OLEYLAMINE | 240° C. | 120 min | 6.4 ± 1.1 nm | CZTS |

2. Characteristics of Semiconductor Nanoparticles (1) TEM Observation

The semiconductor nanoparticles obtained in Examples 1 to 4 were observed with a transmission electron microscope (TEM, Hitachi High Technologies Corporation, Model H-7650). As a TEM grid, a commercial copper grid (Okenshoji) with an elastic carbon support film was used. FIG. 2 shows the obtained TEM images and average particle diameters Dav and standard deviations σ calculated based on the TEM images. Comparison between the TEM images at the respective reaction temperatures shown in FIG. 2 indicates the tendency that the size of the particles produced at the reaction temperatures of 120° C. and 180° C. is larger than analysis (energy dispersive fluorescent X-ray analyzer EDXL300 manufactured by Rigaku Co., Ltd.), the nanoparticles were determined to contain Cu, Zn, and Sn as metal ions at a molar ratio Cu:Zn:Sn=0.38:0.48:0.19. Considering that the theoretical composition of CZTS is Cu:Zn:Sn=0.50:0.25:0.25, the crystal structure of the nanoparticles slightly deviates from the atomic position of the stannite-type crystal structure shown in FIG. 5. This suggests that part of Cu and/or part of Sn is substituted by Zn.

(3) Absorption Spectrum

Figure 7:
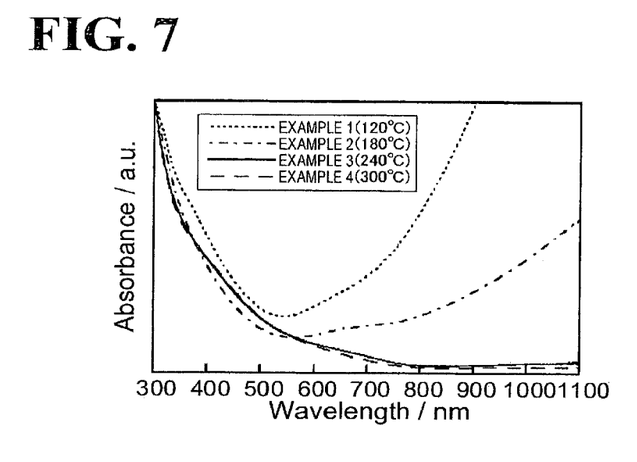
FIG. 7 is a graph showing absorption spectra of Examples 1 to 4.

Absorption spectra of the semiconductor nanoparticles produced in Examples 1 to 4 were measured. The results are shown in FIG. 7. The absorption spectra shown in FIG. 7 indicate that the absorption due to CuS on the long wavelength side (800 nm or more) decreases as the reaction temperature increases and substantially disappears at 240° C. or more. This agrees with the results of the XRD patterns.

(4) Electrochemical Characteristics of CZTS Nanoparticles

Figure 8:
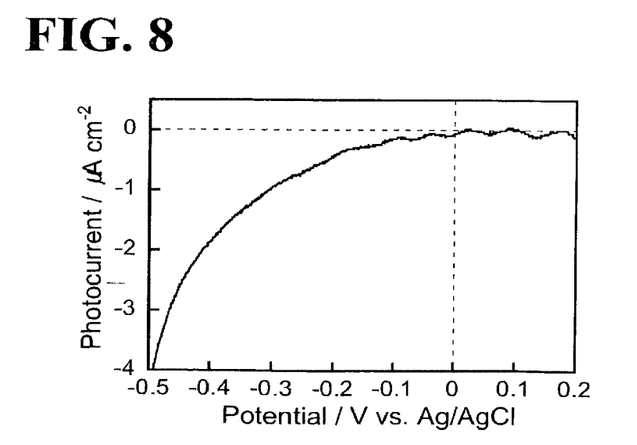
FIG. 8 is a graph showing a current-potential curve of photocurrent.

An FTO substrate was ultrasonically washed with a mixed solution containing acetone and ethanol and then treated with UV-ozone. Then, a proper amount of the semiconductor nanoparticle solution of Example 5 was added dropwise on the washed FTO substrate and dried under reduced pressure to form a semiconductor thin film on the FTO substrate. The photoelectrochemical characteristics were evaluated using a three-electrode cell including the FTO substrate serving as a working electrode. The measurement conditions are given below. The measurement results are shown in FIG. 8.

Electrolytic solution: 0.2 mol·dm$^{-3}$ aqueous europium nitrate solution

Light source: xenon lamp light/heat-ray cut filter (IRA-25S)

Counter electrode: platinum wire

Reference electrode: Ag/AgCl (saturated KCl)

FIG. 8 shows a photocurrent-potential curve of an electrode with the CZTS nanoparticles fixed thereto. The cathodic photocurrent increases as the electrode potential changes from the potential of 0 V vs. Ag/AgCl toward the negative potential side. Therefore, it is found that the resultant CZTS nanoparticles show characteristics similar to p-type semiconductor characteristics, and the holes photoproduced in the particles move to the electrode, thereby reducing chemical species in the solution with photoexcited electrons in the particles.

Example 7

Figure 9:
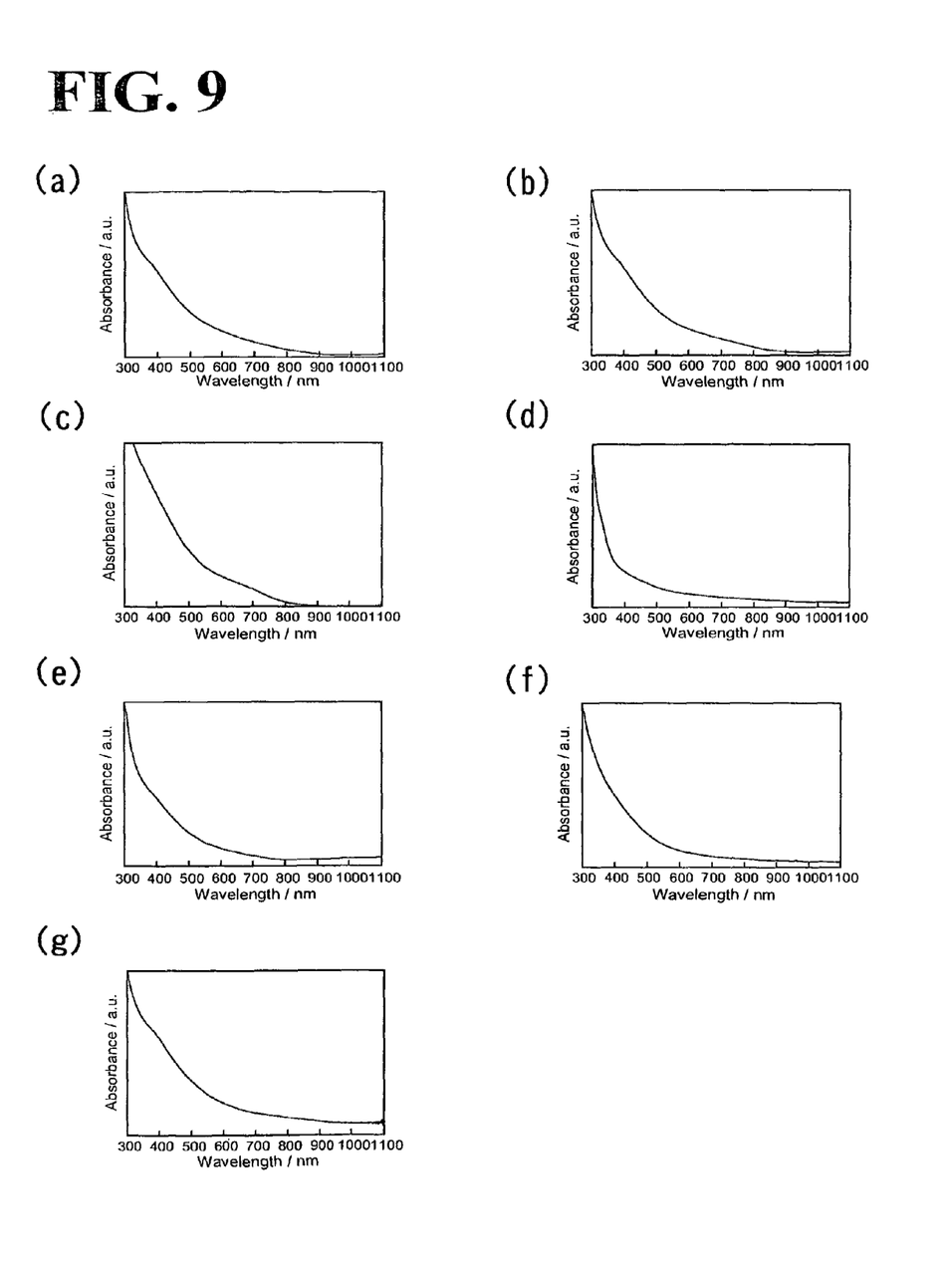
FIG. 9 is a graph showing absorption spectra of Examples 7 to 12.

In Example 7, the same semiconductor nanoparticles as in Example 5 were produced using tin(II) acetate in place of tin(IV) acetate uses as a Sn source in Example 5. Specifically, the semiconductor nanoparticles had a particle diameter of 6.7±1.3 nm, a CZTS crystal structure based on XRD, and an absorption spectral shape having no peak on the long wavelength side of 800 nm or more as shown in FIG. 9(a). In addition, in Example 7, 3 ml of octadecene and 1 g of hexadecylamine were used as a solvent in place of 3 ml of oleylamine. As a result, the same semiconductor nanoparticles as in Example 7 were obtained. Specifically, the semiconductor nanoparticles had a particle diameter of 7.3±1.8 nm and an absorption spectral shape having no peak on the long wavelength side of 800 nm or more as shown in FIG. 9(b).

Example 8

In Example 8, precursor powders of Cu(S$_2$CNEt$_2$)$_2$ as a Cu source, Zn(S$_2$CNEt$_2$)$_2$ as a Zn source, and Sn(S$_2$CNEt$_2$)$_4$ as a Sn source were weighed so that the molar ratio of the elements was Cu:Zn:Sn=2:1:1, and a S source was not further added, followed by the reaction as in Example 2. As a result, the same semiconductor nanoparticles as in Example 3 were produced. Specifically, the semiconductor nanoparticles had a particle diameter of 12.3±3.5 nm, a CZTS crystal structure based on XRD, and an absorption spectral shape having no peak on the long wavelength side of 800 nm or more as shown in FIG. 9(c).

Example 9

In Example 9, copper(II) chloride as a Cu source, zinc chloride as a Zn source, tin(IV) chloride pentahydrate as a Sn source, and a sulfur powder as a S source were used and weighed so that the molar ratio of the elements was Cu:Zn:Sn:S=2:1:1:4, followed by the reaction as in Example 3. As a result, the same semiconductor nanoparticles as in Example 3 were produced. Specifically, the semiconductor nanoparticles had a particle diameter of 6.9±1.8 nm and an absorption spectral shape having no peak on the long wavelength side of 800 nm or more as shown in FIG. 9(d).

Example 10

In Example 10, the sulfur powder used as a S source in Example 3 was replaced by thioacetamide. As a result, the same semiconductor nanoparticles as in Example 3 were produced. Specifically, the semiconductor nanoparticles had a particle diameter of 6.0±1.2 nm and an absorption spectral shape having no peak on the long wavelength side of 800 nm or more as shown in FIG. 9(e).

Example 11

In Example 11, the sulfur powder used as a S source in Example 3 was replaced by thiourea. As a result, the same semiconductor nanoparticles as in Example 3 were produced. Specifically, the semiconductor nanoparticles had a particle diameter of 5.7±1.1 nm and an absorption spectral shape having no peak on the long wavelength side of 800 nm or more as shown in FIG. 9(f).

Example 12

In Example 12, a copper metal powder, a zinc metal powder, a tin metal powder, and a sulfur powder were used and weighed so that the molar ratio of the elements was Cu:Zn:Sn:S=2:1:1:4, followed by reaction as in Example 5. As a result, the same semiconductor nanoparticles as in Example 5 were produced. Specifically, the semiconductor nanoparticles had a particle diameter of 13.6±3.4 nm and an absorption spectral shape having no peak on the long wavelength side of 800 nm or more as shown in FIG. 9(g). In addition, in a measured XRD pattern of the resultant particles, diffraction peaks were observed at 2θ of 29°, 47°, and 56° which sufficiently agreed with diffraction peaks expected from a stannite-type CZTS crystal structure. This suggests that the resultant nanoparticles are stannite-type CZTS.

Others

In Example 3, copper(II) acetate used as the Cu source was replaced by copper(I) acetate, or dodecanethiol was added to the solvent with a reaction time of 60 minutes. As a result, the same semiconductor nanoparticles as in Example 3 were produced. Further, in each of the Examples, a semiconductor nanoparticle solution could be prepared by allowing the heated mixed solution to stand until room temperature to produce precipitates and then adding chloroform to the resultant precipitates.

Example 13

1. Preparation of CZTSSe (Cu$_2$ZnSnS$_{4x}$Se$_{4(1-x)}$: x is a Solid Solution Ratio) Nanoparticles First, 0.1 mmol of copper(II) acetate, 0.05 mmol of zinc(II) acetate, and 0.05 mmol of tin(IV) acetate were weighed, and 2.0 cm$^3$ of oleylamine was added, followed by heating to 60° C. to prepare a solution (first solution). On the other hand, a sulfur powder and selenourea were weighed so that the total of S atoms and Se atoms was 2.0×10$^{-4}$ mol according to the value of solid solution ratio x as shown in Table 2, and 1.0 cm$^3$ of oleylamine was added (second solution). The first solution and second solution were mixed, and a test tube was filled with nitrogen. The test tube was subjected to reaction by heating at a reaction temperature of 240° C. for 60 minutes and then allowed to stand until room temperature. The resultant product was separated into a supernatant and precipitates by centrifugal separation. The separated supernatant of the product was filtered, and methanol was added to the filtrate to precipitate nanoparticles. A supernatant was removed by centrifugal separation, and the precipitates were dissolved by adding chloroform to prepare a CZTSSe nanoparticle solution.

TABLE 2

| Solid Solution Ratio x | Cu | Zn | Sn | S | Se |
|---|---|---|---|---|---|
| 1 | 0.1 mmol | 0.05 mmol | 0.05 mmol | 0.2 mmol | 0 |
| 0.5 | 0.1 mmol | 0.05 mmol | 0.05 mmol | 0.1 mmol | 0.1 mmol |
| 0 | 0.1 mmol | 0.05 mmol | 0.05 mmol | 0 | 0.2 mmol |

2. Characteristics of CZTSSe Nanoparticles

Figure 10:
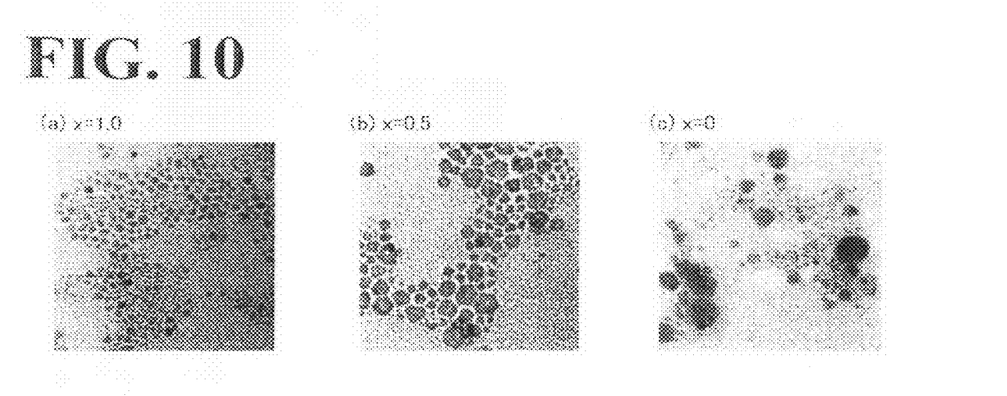
FIG. 10 is a photograph showing TEM images of CZTSSe nanoparticles of Example 13.
Figure 11:
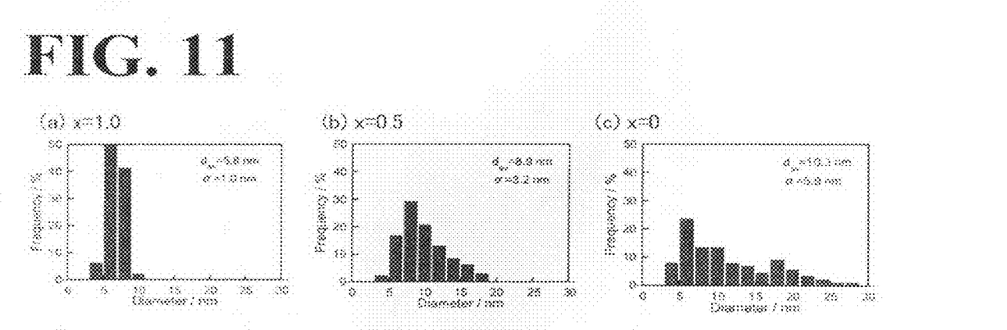
FIG. 11 is a graph showing particle size distributions of CZTSSe nanoparticles of Example 13.

FIGS. 10 and 11 show TEM images and particle size distributions, respectively, of the CZTSSe nanoparticles prepared as described above in 1. These figures show the tendency that the particle size increases as the composition x of the particles changes from 1 to 0. This is considered to be due to the fact that selenium is slowly supplied because of the relatively low rate of thermal decomposition of selenourea, and thus larger particles are grown at a higher ratio of selenourea.

Figure 12:
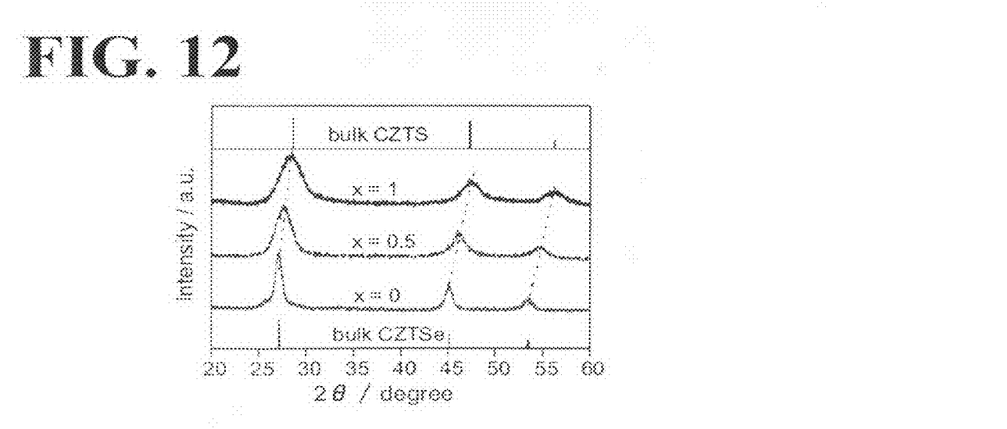
FIG. 12 is a graph showing XRD patterns of CZTSSe nanoparticles of Example 13.
Figure 13:
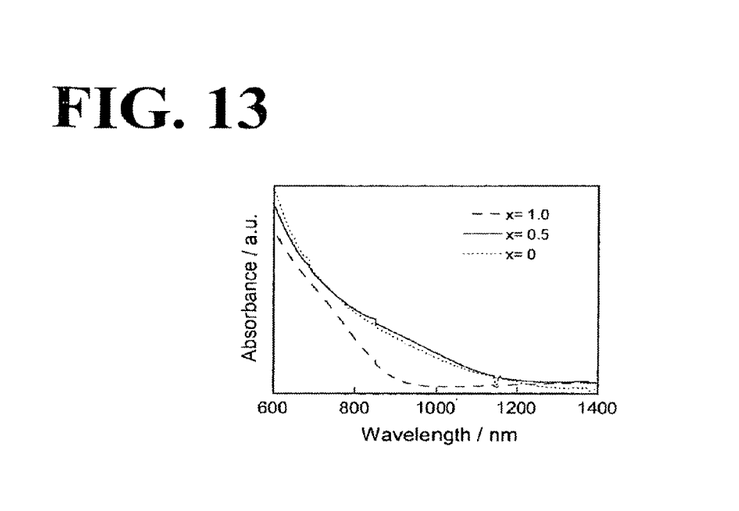
FIG. 13 is a graph showing absorption spectra of CZTSSe nanoparticles of Example 13.

FIGS. 12 and 13 show XRD patterns and absorption spectra, respectively, of the CZTSSe nanoparticles. FIG. 12 reveals that a XRD pattern of the particles at x=1 well agrees with the XRD pattern of CZTS (ICSD collection code: 171983), and a XRD pattern of the particles at x=0 well agrees with the XRD pattern of CZTSe ($Cu_2ZnSnSe_4$) (ICSD collection code: 095117). In a XRD pattern of the particles at x=0.5, each of the peaks is observed at an intermediate position between the diffraction peaks of the particles at x=0 and x=1, and thus it is found that the particles at x=0.5 include an intermediate solid solution between CZTS and CZTSe. The absorption spectra (FIG. 13) indicate that the absorption edges of the particles at x=1 and x=0 are near 900 nm and 1200 nm, respectively. On the other hand, the absorption edge of the particles at x=0.5 is near 1200 nm which is substantially the same as the particles at x=0.

The results of EDX composition analysis of the CZTSSe nanoparticles are shown in Table 3. In view of only the metal ratio, the ratio of Cu, Zn, and Sn is close to 2:1:1, and as the Se amount increases, the Cu amount tends to decrease and the Sn amount tend to increase. In addition, in view of anion, the S amount is small. Since the Se ratio in the particles x=1 or 0.5 is substantially close to the theoretical vale, it is suggested that S is difficult to detect or is actually deficient.

TABLE 3

| SOLID SOLUTION RATIO x | AMOUNT OF ELEMENT CONTAINED (atom %) | | | | |
|---|---|---|---|---|---|
| | Cu | Zn | Sn | S | Se |
| 1 | 33.0 | 17.4 | 15.9 | 33.7 | 0.0 |
| 0.5 | 31.2 | 12.8 | 16.8 | 13.8 | 25.4 |
| 0 | 27.4 | 13.2 | 17.0 | 0.0 | 42.4 |

Example 14

1. Preparation of AZTS ($Ag_2ZnSnS_4$) Nanoparticles (1) Preparation of $Ag(S_2CNEt_2)$, $Zn(S_2CNEt_2)_2$, and $Sn(S_2CNEt_2)_4$ Complexes First, a 0.050 mol·dm$^{-3}$ aqueous silver nitrate solution, a 0.025 mol·dm$^{-3}$ aqueous zinc nitrate solution, or a 0.0125 mol·dm$^{-3}$ aqueous tin chloride solution (50 cm$^3$) was added to a 0.050 mol·dm$^{-3}$ aqueous solution (50 cm$^3$) of sodium N,N-diethyldithiocarbamate ($NaS_2CNEt_2$) under stirring at room temperature. Then, the resultant mixture was stirred for 30 minutes to produce precipitates. The precipitates were isolated by centrifugal separation (4000 rpm, 5 minutes), washed with water four times and washed with methanol two times, and then dried under reduced pressure overnight, producing a powder of $Ag(S_2CNEt_2)$ complex, $Zn(S_2CNEt_2)_2$ complex or $Sn(S_2CNEt_2)_4$ complex.

(2) Preparation of Oleylamine-Modified AZTS Nanoparticles

Each of the complexes prepared as described above in (1) was weighed so that the amount of Ag atoms was 0.10 mmol, the amount of Zn atoms was 0.050 mmol, and the amount of Sn atoms was 0.050 mmol, and 3.0 cm$^3$ of oleylamine was added, followed by heating at 300° C. for 30 minutes under stirring in a nitrogen gas atmosphere. The resultant precipitates were separated by centrifugal separation. Then, the precipitates were dissolved by adding 1.0 cm$^3$ of chloroform, and the undissolved residue was removed by centrifugal separation. Further, 3.0 cm$^3$ of methanol was added to the resultant chloroform solution to produce precipitates as target particles. An absorption spectrum was measured by dissolving again the particles in 1.0 cm$^3$ of chloroform.

2. Characteristics of AZTS Nanoparticles

Figure 14:
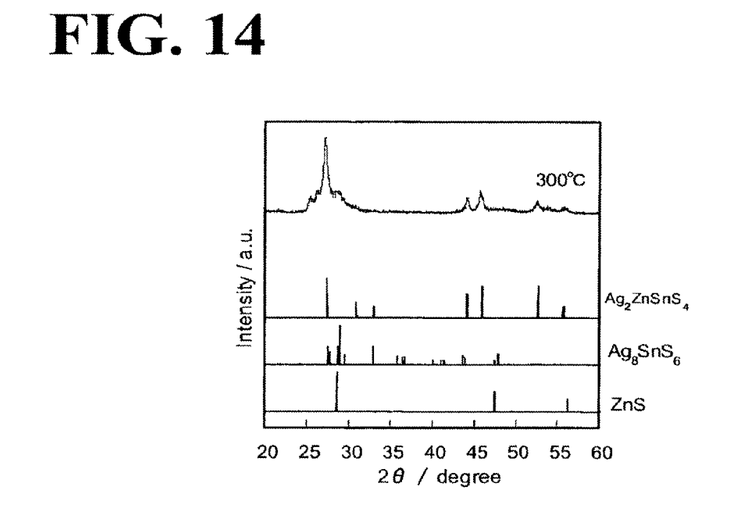
FIG. 14 is a graph showing a XRD pattern of AZTS nanoparticles of Example 14.
Figure 15:
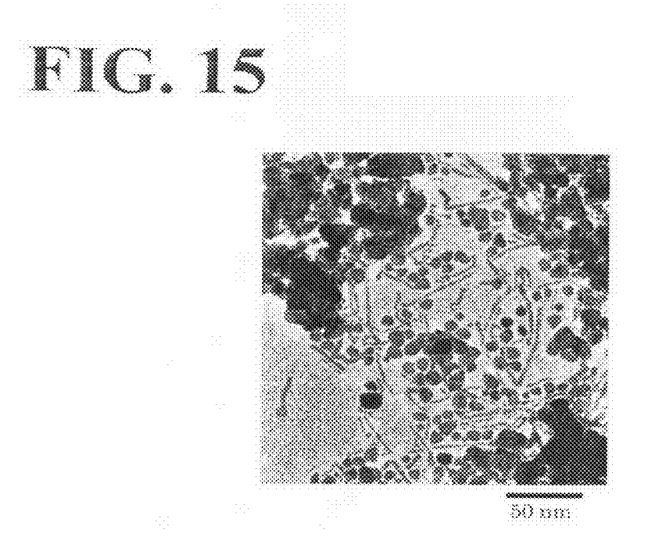
FIG. 15 is a photograph showing a TEM image of AZTS nanoparticles of Example 14.

FIG. 14 shows XRD patterns of the particles prepared as described above in 1(2). For comparison, FIG. 14 also shows diffraction patterns of AZTS, $Ag_8SnS_6$, and cubic ZnS. FIG. 14 indicates that the diffraction pattern of the particles well agrees with the diffraction pattern of AZTS. FIG. 15 shows a TEM image of the particles. FIG. 15 indicates that spherical particles with a size of 10 to 30 nm are produced. The above reveals that AZTS nanoparticles are produced by heating at a reaction temperature of 300° C.

Figure 16:
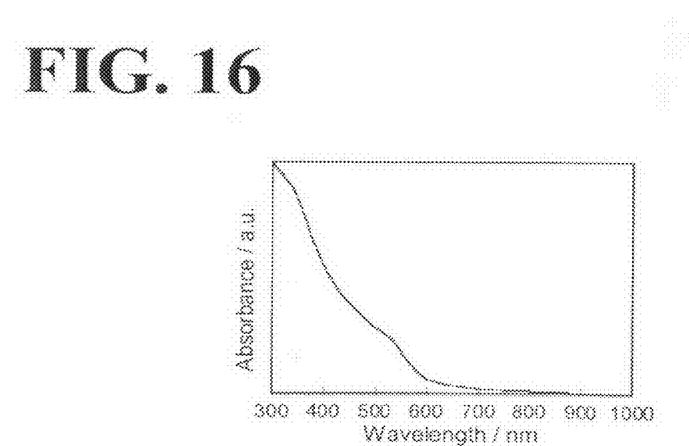
FIG. 16 is a graph showing an absorption spectrum of AZTS nanoparticles of Example 14.

FIG. 16 shows an absorption spectrum of the AZTS nanoparticles prepared as described above in 1(2). As seen from FIG. 16, an abrupt rise of absorption is observed near 600 nm in the absorption spectrum, and further an exciton peak is observed near 550 nm. The band gap energy (Eg) of the nanoparticles, which was estimated from the absorption edge, was 2.1 eV. Since the Eg of bulk AZTS is reported to be 2.0 eV, it is suggested that the AZTS nanoparticles prepared in this Example have substantially the same electronic energy structure as the bulk.

This application claims priority of Japanese Patent Application No. 2009-046785 filed on Feb. 27, 2009, the entire contents of which are incorporated herein by reference.

INDUSTRIAL APPLICABILITY

The present invention can be used for, for example, materials of solar cells.

The invention claimed is:

1. A method for producing semiconductor nanoparticles, comprising:
    preparing a mixed solution by adding, to a lipid-soluble solvent,
        a simple substance or compound of a Group 11 element in the periodic table, a simple substance or compound of a Group 12 element in the periodic table,
a simple substance or compound of a Group 14 element in the periodic table, and
a simple substance or compound of a Group 16 element in the periodic table; and
heating the mixed solution at a temperature of from 240° C. to 300° C. to produce semiconductor nanoparticles.

2. The method for producing semiconductor nanoparticles according to claim 1, wherein
the Group 11 element in the periodic table is Cu, Ag, or Au,
the Group 12 element in the periodic table is Zn or Cd,
the Group 14 element in the periodic table is Si, Ge, Sn, or Pb, and
the Group 16 element in the periodic table is at least one selected from the group consisting of O, S, Se, and Te.

3. The method for producing semiconductor nanoparticles according to claim 1, wherein
the Group 11 element in the periodic table is Cu,
the Group 12 element in the periodic table is Zn,
the Group 14 element in the periodic table is Sn, and
the Group 16 element in the periodic table is S.

4. The method for producing semiconductor nanoparticles according to claim 1, wherein the lipid-soluble solvent is a nitrogen-containing compound containing a hydrocarbon group having 4 to 20 carbon atoms.

5. The method for producing semiconductor nanoparticles according to claim 1, further comprising:
cooling the heated mixed solution; and
after the cooling,
separating a product from a supernatant; and then
placing the product in an organic solvent to produce a semiconductor nanoparticle solution.

6. The method for producing semiconductor nanoparticles according to claim 1, further comprising:
cooling the heated mixed solution; and
after the cooling,
separating a product from a supernatant;
adding a solvent in which the nanoparticles are insoluble or slightly soluble to a supernatant separated from the product to produce precipitates; and
collecting the precipitates and placing the precipitates in an organic solvent to produce a semiconductor nanoparticle solution.

7. Semiconductor nanoparticles produced by the method for producing semiconductor nanoparticles according to claim 1.

* * * * *